(12) United States Patent
Cho et al.

(10) Patent No.: US 8,912,633 B2
(45) Date of Patent: *Dec. 16, 2014

(54) IN-SITU PHOTORESIST STRIP DURING PLASMA ETCHING OF ACTIVE HARD MASK

(75) Inventors: Sangjun Cho, Pleasanton, CA (US); Tom Choi, Santa Clara, CA (US); Taejoon Han, San Ramon, CA (US); Sean Kang, San Ramon, CA (US); Prabhakara Gopaladasu, Fremont, CA (US); Bi-Ming Yen, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/607,390

(22) Filed: Sep. 7, 2012

(65) Prior Publication Data
US 2013/0001754 A1 Jan. 3, 2013

Related U.S. Application Data

(62) Division of application No. 11/807,011, filed on May 24, 2007, now Pat. No. 8,283,255.

(51) Int. Cl.
| | | |
|---|---|---|
| *H01L 21/3213* | (2006.01) | |
| *H01L 21/311* | (2006.01) | |
| *G03F 7/42* | (2006.01) | |
| *H01L 21/308* | (2006.01) | |

(52) U.S. Cl.
CPC ............ *H01L 21/3081* (2013.01); *G03F 7/427* (2013.01); *H01L 21/31138* (2013.01); *H01L 21/32139* (2013.01)
USPC ............................ 257/632; 438/714; 438/703

(58) Field of Classification Search
CPC .................. H01L 21/31122; H01L 21/31144; H01L 21/31116; H01L 21/32139; H01L 37/32082; H01L 21/31138; H01L 21/3081; G03F 7/427

USPC ............ 156/345.26, 345.24, 345.48, 345.33; 438/710, 712–719; 257/E21.249; 216/58, 2

See application file for complete search history.

(56) References Cited

U.S. PATENT DOCUMENTS

| 6,037,266 A | 3/2000 | Tao et al. |
|---|---|---|
| 6,069,091 A | 5/2000 | Chang et al. |

(Continued)

FOREIGN PATENT DOCUMENTS

| CN | 1633701 A | 6/2005 |
|---|---|---|
| EP | 1 195 801 A2 | 4/2002 |

(Continued)

OTHER PUBLICATIONS

International Search Report dated Nov. 20, 2008 for International Application No. PCT/US2008/064159.

(Continued)

*Primary Examiner* — Jarrett Stark
*Assistant Examiner* — Bitew Dinke
(74) *Attorney, Agent, or Firm* — Beyer Law Group LLP

(57) ABSTRACT

A method for etching features in a silicon layer is provided. A hard mask layer is formed over the silicon layer. A photoresist layer is formed over the hard mask layer. The hard mask layer is opened. The photoresist layer is stripped by providing a stripping gas; forming a plasma with the stripping gas by providing a high frequency RF power and a low frequency RF power, wherein the low frequency RF power has a power less than 50 watts; and stopping the stripping gas when the photoresist layer is stripped. The opening the hard mask layer and the stripping the photoresist layer are performed in a same chamber.

20 Claims, 6 Drawing Sheets

(56) References Cited

U.S. PATENT DOCUMENTS

| | | | |
|---|---|---|---|
| 6,287,962 | B1 | 9/2001 | Lin |
| 6,362,110 | B1 | 3/2002 | Marks |
| 6,426,304 | B1 | 7/2002 | Chien et al. |
| 6,777,344 | B2 | 8/2004 | Annapragada et al. |
| 6,852,472 | B2 | 2/2005 | Lee et al. |
| 7,052,552 | B2* | 5/2006 | Kwan et al. ............... 118/697 |
| 7,135,410 | B2* | 11/2006 | Jacobs et al. ............... 438/712 |
| 7,347,915 | B1* | 3/2008 | Keil et al. ............... 156/345.47 |
| 7,479,458 | B1* | 1/2009 | Hwang et al. ............... 438/714 |
| 7,682,479 | B2* | 3/2010 | Huang et al. ............ 156/345.26 |
| 7,682,480 | B2* | 3/2010 | Kanarik et al. ........... 156/345.28 |
| 7,682,979 | B2* | 3/2010 | Fu et al. ............... 438/710 |
| 7,749,353 | B2* | 7/2010 | Rusu et al. ............ 156/345.47 |
| 7,772,122 | B2* | 8/2010 | Cirigliano et al. ............ 438/696 |
| 7,785,484 | B2* | 8/2010 | Heo et al. ............... 216/47 |
| 7,789,991 | B1* | 9/2010 | Worsham et al. ........ 156/345.26 |
| 7,838,426 | B2* | 11/2010 | Goyal et al. ............... 438/694 |
| 8,172,948 | B2* | 5/2012 | Heo et al. ............... 118/715 |
| 8,172,980 | B2* | 5/2012 | Sadjadi et al. ............ 156/345.26 |
| 8,187,412 | B2* | 5/2012 | Sadjadi et al. ............ 156/345.26 |
| 8,236,188 | B2* | 8/2012 | Ji et al. ............... 216/67 |
| 8,268,118 | B2* | 9/2012 | Lee et al. ............... 156/345.38 |
| 8,277,670 | B2* | 10/2012 | Heo et al. ............... 216/41 |
| 8,283,255 | B2* | 10/2012 | Cho et al. ............... 438/714 |
| 8,357,263 | B2* | 1/2013 | Berkoh et al. ............. 156/345.13 |
| 8,440,473 | B2* | 5/2013 | Xu et al. ............... 438/7 |
| 8,500,951 | B2* | 8/2013 | Kim et al. ............ 156/345.26 |
| 8,668,805 | B2* | 3/2014 | Kota et al. ............... 156/345.26 |
| 8,671,878 | B2* | 3/2014 | Zhong et al. ............... 118/697 |
| 2002/0111041 | A1 | 8/2002 | Annapragada et al. |
| 2003/0162407 | A1 | 8/2003 | Maex et al. |
| 2004/0018739 | A1 | 1/2004 | Abooameri et al. |
| 2004/0072430 | A1* | 4/2004 | Huang et al. ............... 438/689 |
| 2004/0072443 | A1* | 4/2004 | Huang et al. ............... 438/710 |
| 2004/0094402 | A1* | 5/2004 | Gopalraja et al. ........ 204/192.12 |
| 2004/0260420 | A1 | 12/2004 | Ohno et al. |
| 2005/0037624 | A1* | 2/2005 | Huang et al. ............... 438/709 |
| 2005/0064714 | A1* | 3/2005 | Mui et al. ............... 438/706 |
| 2005/0079710 | A1 | 4/2005 | Zhu et al. |
| 2005/0233590 | A1* | 10/2005 | Yao et al. ............... 438/706 |
| 2006/0124242 | A1* | 6/2006 | Kanarik et al. ............ 156/345.24 |
| 2006/0166145 | A1* | 7/2006 | Xiao et al. ............... 430/323 |
| 2006/0226120 | A1* | 10/2006 | Rusu et al. ............... 216/67 |
| 2006/0258148 | A1* | 11/2006 | Zhu et al. ............... 438/624 |
| 2007/0123017 | A1* | 5/2007 | Sadjadi et al. ............... 438/597 |
| 2007/0128849 | A1* | 6/2007 | Yao et al. ............... 438/627 |
| 2007/0269721 | A1* | 11/2007 | Kim et al. ............... 430/5 |
| 2007/0281491 | A1* | 12/2007 | Kamp ............... 438/717 |
| 2008/0050923 | A1* | 2/2008 | Kim et al. ............... 438/706 |
| 2009/0184089 | A1* | 7/2009 | Chebi et al. ............... 216/13 |
| 2010/0327413 | A1* | 12/2010 | Lee et al. ............... 257/618 |
| 2013/0000846 | A1* | 1/2013 | Romano et al. ............ 156/345.24 |
| 2013/0020026 | A1* | 1/2013 | Sheu et al. ............... 156/345.24 |
| 2013/0062735 | A1* | 3/2013 | Fu et al. ............... 257/618 |
| 2013/0087284 | A1* | 4/2013 | Adams et al. ............ 156/345.26 |
| 2013/0264201 | A1* | 10/2013 | Edelberg ............... 204/298.34 |
| 2013/0299089 | A1* | 11/2013 | Kim et al. ............... 156/345.26 |

FOREIGN PATENT DOCUMENTS

| | | |
|---|---|---|
| JP | 2003-303808 | 10/2003 |
| KR | 10-2004-0028717 | 4/2004 |
| KR | 10-2006-0107758 | 10/2006 |
| KR | 10-2007-0002797 | 1/2007 |
| WO | WO 02/065513 | 8/2002 |
| WO | WO 2005/038892 A1 | 4/2005 |

OTHER PUBLICATIONS

Written Opinion dated Nov. 20, 2008 for International Application No. PCT/US2008/064159.

Examination report dated Apr. 18, 2011 from Singapore Patent Application No. 200907526-8.

Search report dated Apr. 18, 2011 from Singapore Patent Application No. 200907526-8.

Office Action dated Feb. 17, 2011 from Chinese Patent Application No. 200880017184.5.

Office Action dated Mar. 31, 2010 from U.S. Appl. No. 11/807,011.

Final Office Action dated Sep. 9, 2010 from U.S. Appl. No. 11/807,011.

Office Action dated Aug. 3, 2011 from U.S. Appl. No. 11/807,011.

Final Office Action dated Dec. 6, 2011 from U.S. Appl. No. 11/807,011.

Notice of Allowance dated Jun. 8, 2012 from U.S. Appl. No. 11/807,011.

Donaton et al., "Integration of Cu and low-k dielectrics: effect of hard mask and dry etch on electrical performance of damascene structures," Microelectronic Engineering, vol. 55, 2001, pp. 277-283.

\* cited by examiner

IN-SITU PHOTORESIST STRIP DURING PLASMA ETCHING OF ACTIVE HARD MASK

CROSS REFERENCE TO RELATED APPLICATIONS

This application is a divisional of and claims priority under 35 U.S.C. §120 to co-pending U.S. patent application Ser. No. 11/807,011 filed on May 24, 2007 and entitled "IN-SITU PHOTORESIST STRIP DURING PLASMA ETCHING OF ACTIVE HARD MASK" which is incorporated by reference herein for all purposes.

BACKGROUND OF THE INVENTION

The present invention relates to etching a silicon layer through a hard mask during the production of a semiconductor device. More specifically, the present invention relates to in-situ stripping of the photoresist after opening the hard mask.

During semiconductor wafer processing, features of the semiconductor device may be defined by a patterned hard mask. The semiconductor device features may be transferred into the hard mask using a photoresist and by plasma etching of the hard mask. After the features are transferred into the hard mask, the remaining photoresist on the hard mask may be removed.

Traditionally, separate equipments are used to open the hard mask and remove the photoresist. After the opening of the hard mask, wafers are removed from the plasma reactor and placed into a separate ashing equipment for stripping the remaining photoresist. In this case, another expensive equipment is needed solely for the stripping of the photoresist, which requires additional fabrication space and wafer processing time. Removing the wafers from the plasma chamber may cause wafers to come in contact with the environment, which may lead to modification of the etched surfaces and cause inconsistent wafer surface conditions before the stripping process.

SUMMARY OF THE INVENTION

To achieve the foregoing and in accordance with the purpose of the present invention a method for etching features in a silicon layer is provided. A hard mask layer is formed over the silicon layer. A photoresist layer is formed over the hard mask layer. The hard mask layer is opened. The photoresist layer is stripped by providing a stripping gas; forming a plasma with the stripping gas by providing a high frequency RF power and a low frequency RF power, wherein the low frequency RF power has a power less than 50 watts; and stopping the stripping gas when the photoresist layer is stripped.

In another embodiment of the invention, a method for etching features in a silicon layer is provided. A hard mask layer is formed over the silicon layer. A bottom anti-reflection coating layer is formed over the hard mask layer. A photoresist layer is formed over the bottom anti-reflection coating layer. The bottom anti-reflection coating layer is opened. The hard mask layer is opened. The bottom anti-reflection coating layer and the photoresist layer are stripped by providing a stripping gas; forming a plasma with the stripping gas by providing a high frequency RF power and a low frequency RF power, wherein the low frequency RF power has a power less than 50 watts; and stopping the stripping gas when the photoresist layer is stripped.

In yet another embodiment of the invention, an apparatus for etching features in a silicon layer, wherein the silicon layer is under a hard mask layer, which in turn is under a photoresist layer, is provided. The apparatus comprises a plasma processing chamber, a gas source, and a controller.

The plasma processing chamber comprises a chamber wall forming a plasma processing chamber enclosure; a substrate support for supporting a substrate within the plasma processing chamber enclosure; a pressure regulator for regulating the pressure in the plasma processing chamber enclosure; at least one electrode for providing power to the plasma processing chamber enclosure for sustaining a plasma; at least one RF power source electrically connected to the at least one electrode; a gas inlet for providing gas into the plasma processing chamber enclosure; and a gas outlet for exhausting gas from the plasma processing chamber enclosure.

The gas source is in fluid connection with the gas inlet of the plasma processing chamber, and comprises an opening gas source; and a stripping gas source.

The controller is controllably connected to the gas source and the at least one RF power source of the plasma processing chamber, and comprises at least one processor; and computer readable media, which comprises computer readable code for opening the hard mask layer; and computer readable code for stripping the photoresist layer, which comprises computer readable code for providing a stripping gas; computer readable code for forming a plasma with the stripping gas by providing a high frequency RF power and a low frequency RF power, wherein the low frequency RF power has a power less than 50 watts; and computer readable code for stopping the stripping gas when the photoresist layer is stripped.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
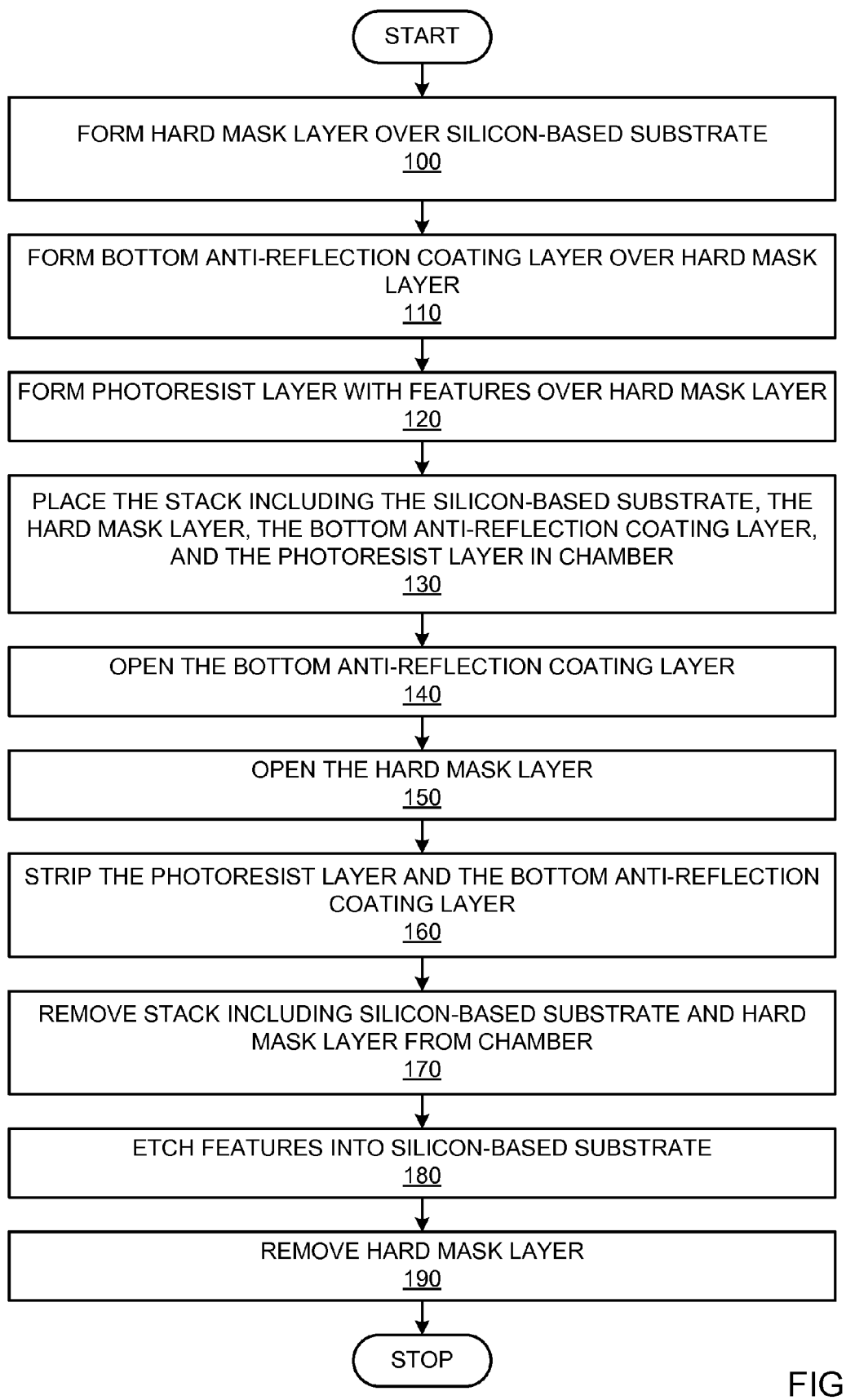
FIG. 1 is a high level flow chart of an embodiment of the invention.

To facilitate understanding, FIG. 1 is a high level flow chart of a process used in an embodiment of the invention. A hard mask layer is formed over a silicon layer (step 100). The silicon layer may be polysilicon, crystalline silicon, such as a silicon wafer, amorphous silicon, or any other types of silicon. The silicon layer is generally a pure silicon, which may have a dopant.

A bottom anti-reflection coating (BARC) layer is formed over the hard mask layer (step 110). The bottom anti-reflection coating layer is optional. In another embodiment, the bottom anti-reflection coating layer may not be used. A photoresist layer is formed over the bottom anti-reflection coating layer (step 120). The photoresist layer consists of features, which will eventually be etched into the silicon layer.

The stack that includes the silicon layer, the hard mask layer, the bottom anti-reflection coating layer, and the photoresist layer is placed in a processing chamber (step 130). The bottom anti-reflection coating layer is opened using an opening gas (step 140). This process involves plasma etching the bottom anti-reflection coating layer to transfer the features defined in the photoresist layer into the bottom anti-reflection coating layer. The hard mask layer is then opened using an opening gas (step 150). This process involves plasma etching the hard mask layer to transfer the features defined in the photoresist layer into the hard mask layer.

The remaining photoresist layer and bottom anti-reflection coating layer are removed or stripped (step 140). In one embodiment, a low bias power process with oxidation chemistry is used to strip the remaining photoresist and bottom anti-reflection coating layers immediately or shortly after the opening of the hard mask. The stripping gas may comprise $O_2$, $N_2$, or $H_2$, and may have a halogen addition.

The opening of the bottom anti-reflection coating layer and the hard mask layer (steps 140 and 150) and the stripping of the photoresist layer and the bottom anti-reflection coating layer (step 160) are performed in-situ, in the same plasma chamber. Thereafter, the stack with the silicon layer and the opened hard mask layer are removed from the chamber (step 170). Now the silicon layer is ready to be patterned using the hard mask layer. In one embodiment, the stack with the silicon layer and the opened hard mask layer is placed in another plasma processing chamber. The features are then etched into the silicon layer to define active areas (step 180). The hard mask is then completely removed (step 190).

Figure 2:
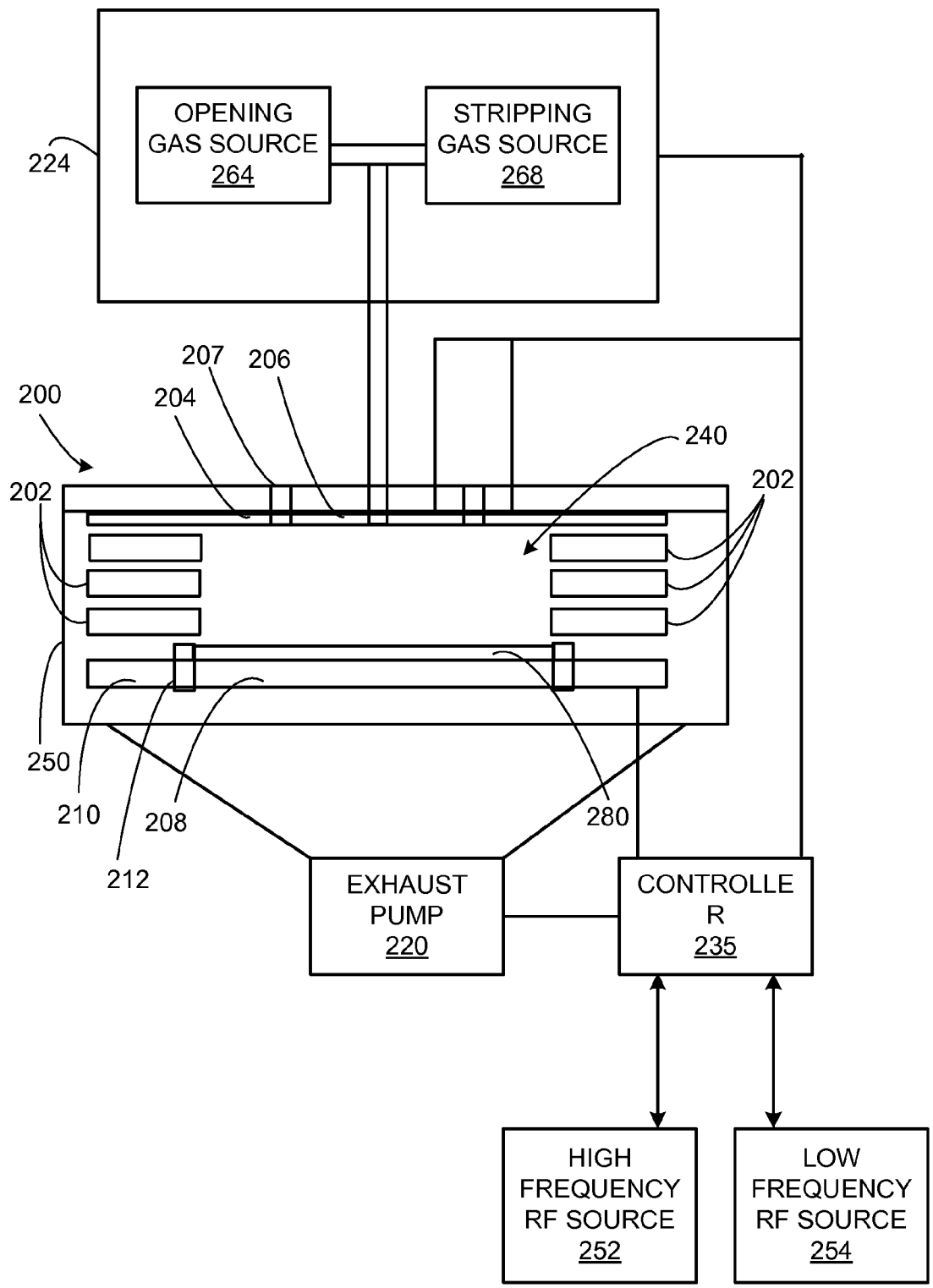
FIG. 2 is a schematic view of a plasma processing chamber that may be used for etching.

FIG. 2 is a schematic view of a plasma reactor that may be used in practicing the invention. In one or more embodiments of the invention, a plasma reactor 200 comprises a top central electrode 206, top outer electrode 204, bottom central electrode 208, and a bottom outer electrode 210, within a chamber wall 250. A top insulator ring 207 insulates the top central electrode 206 from the top outer electrode 204. A bottom insulator ring 212 insulates the bottom central electrode 208 from the bottom outer electrode 210. Also within the plasma reactor 200, a substrate 280 is positioned on top of the bottom central electrode 208. Optionally, the bottom central electrode 208 incorporates a suitable substrate chucking mechanism (e.g., electrostatic, mechanical clamping, or the like) for holding the substrate 280.

A gas source 224 is connected to the plasma reactor 200 and supplies opening and stripping gas into a plasma region 240 of the plasma reactor 200. In this example, the gas source 224 comprises an opening gas source 264 and a stripping gas source 268. The opening gas source 264 supplies gas for opening the hard mask layer. The stripping gas source 268 supplies gas for stripping or removing the remaining photoresist layer on the hard mask layer after the hard mask is opened.

A high frequency RF source 252 and a low frequency RF source 254 are electrically connected to the plasma reactor 200 through a controller 235 to provide power to the electrodes 204, 206, 208, and 210. The high frequency RF source 252 generates high frequency RF power and supplies the high frequency RF power to the plasma reactor 200. Preferably, the high frequency RF power has a frequency greater than or equal to 20 mega Hertz (MHz). More preferably, the high frequency RF power has a frequency greater than or equal to 27 MHz. Even more preferably, the high frequency RF power has a frequency greater than or equal to 60 MHz.

The low frequency RF source 254 generates low frequency RF power and supplies the low frequency RF power to the plasma reactor 200. Preferably, the low frequency RF power has a frequency less than or equal to 20 mega Hertz (MHz). More preferably, the low frequency RF power has a frequency less than or equal to 10 MHz. Even more preferably, the low frequency RF power has a frequency less than or equal to 2 MHz.

The controller 235 is connected to the gas source 224, the high frequency RF source 252, and the low frequency RF source 254. The controller 235 controls the flow of the opening and stripping gas into the plasma reactor 200, as well as the generation of the RF power from the high frequency RF source 252, the low frequency RF source 254, the electrodes 204, 206, 208, and 210, and the exhaust pump 220.

In this example, confinement rings 202 are provided to provide confinement of the plasma and gas, which pass between the confinement rings and are exhausted by the exhaust pump 220.

Figure 3A:
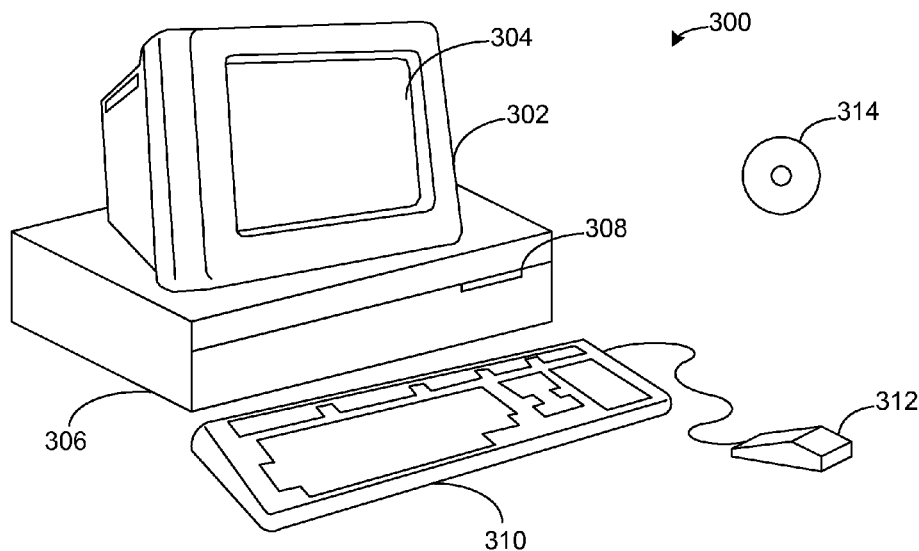
FIGS. 3A-B illustrate a computer system, which is suitable for implementing a controller used in embodiments of the present invention.
Figure 3B:
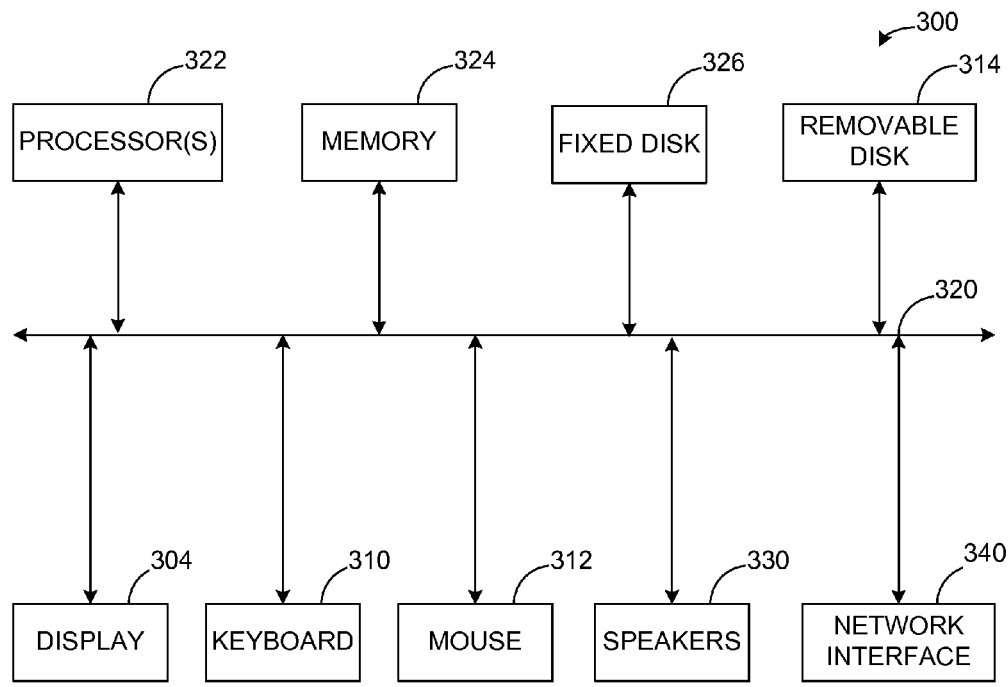

FIGS. 3A and 3B illustrate a computer system, which is suitable for implementing the controller 235 used in one or more embodiments of the present invention. FIG. 3A shows one possible physical form of the computer system 300. Of course, the computer system may have many physical forms ranging from an integrated circuit, a printed circuit board, and a small handheld device up to a huge super computer. Computer system 300 includes a monitor 302, a display 304, a housing 306, a disk drive 308, a keyboard 310, and a mouse 312. Disk 314 is a computer-readable medium used to transfer data to and from computer system 300.

FIG. 3B is an example of a block diagram for computer system 300. Attached to system bus 320 is a wide variety of subsystems. Processor(s) 322 (also referred to as central processing units, or CPUs) are coupled to storage devices, including memory 324. Memory 324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 326 is also coupled bi-directionally to CPU 322; it provides additional data storage capacity and may also include any of the computer-readable media described below. Fixed disk 326 may be used to store programs, data, and the like and is typically a secondary storage medium (such as a hard disk) that is slower than primary storage. It will be appreciated that the information retained within fixed disk 326 may, in appropriate cases, be incorporated in standard fashion as virtual memory in memory 324. Removable disk 314 may take the form of any of the computer-readable media described below.

CPU 322 is also coupled to a variety of input/output devices, such as display 304, keyboard 310, mouse 312, and speakers 330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 322 optionally may be coupled to another computer or telecommunications network using network interface 340. With such a network interface, it is contemplated that the CPU might receive information from the network, or might output information to the network in the course of performing the above-described method steps. Furthermore, method embodiments of the present invention may execute solely upon CPU 322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level of code that are executed by a computer using an interpreter. Computer readable media may also be computer code transmitted by a computer data signal embodied in a carrier wave and representing a sequence of instructions that are executable by a processor.

Figure 4A:
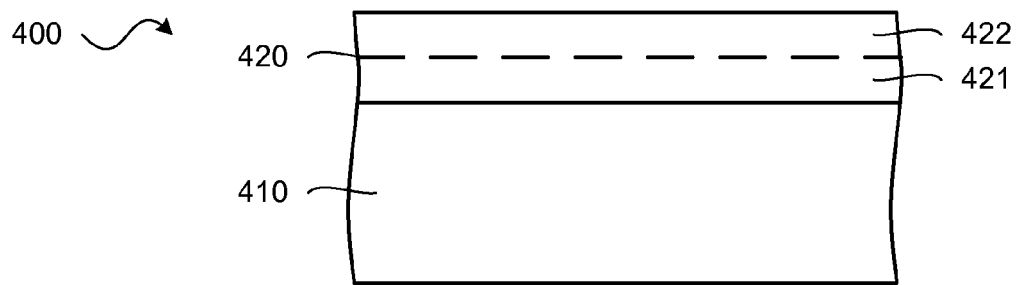
FIGS. 4A-H are schematic views of a stack processed according to an embodiment of the invention.

To facilitate understanding of the invention, FIG. 4A is a schematic cross-sectional illustration of a stack 400 with a silicon layer 410. Eventually, features will be etched into this silicon layer to define active areas. The silicon layer 410 is generally pure silicon, not silicon oxide or silicon nitride. In this example, the silicon layer 410 is a silicon wafer or silicon substrate. A hard mask layer 420 is formed over the silicon substrate 410 (step 100). In this embodiment, the hard mask layer 420 may be silicon-based. For example, the hard mask layer 420 may be dielectric materials, such as $SiO_2$, SiON, or $Si_3N_4$. The hard mask layer 420 may comprise a single layer of a particular material or multiple layers of different materials and has a thickness. For example, in the embodiment shown in FIG. 4A, the hard mask layer 420 comprises a layer of $SiO_2$ 422 of approximately 1000 Angstrom in thickness over a layer of $Si_3N_4$ 421 of approximately 1000 Angstrom in thickness.

Figure 4B:
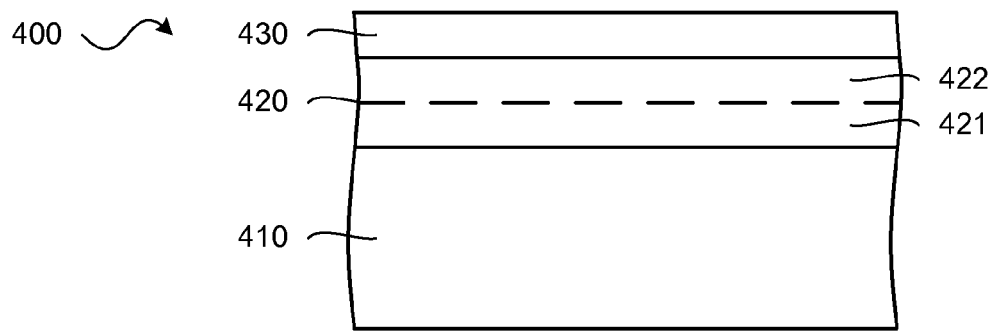

A bottom anti-reflection coating layer 430 is formed over the hard mask layer 420 (step 110), as shown in FIG. 4B. Typically, a bottom anti-reflection coating layer 430 is formed between a material layer (in this case, the hard mask layer 420) that is to be patterned on a semiconductor structure using photolithography and an overlying photoresist layer (see step 120 and FIG. 4C below) in order to suppress the reflections from the material layer surface into the photoresist layer that may degrade the patterning. The bottom anti-reflection coating layer 430 is optional. In another embodiment, the bottom anti-reflection coating may not be used. The bottom anti-reflection coating layer 430, is present, has a thickness. For example, in the embodiment shown in FIG. 4B, the bottom anti-reflection coating layer 430 has a thickness of approximately 900 Angstrom.

Figure 4C:
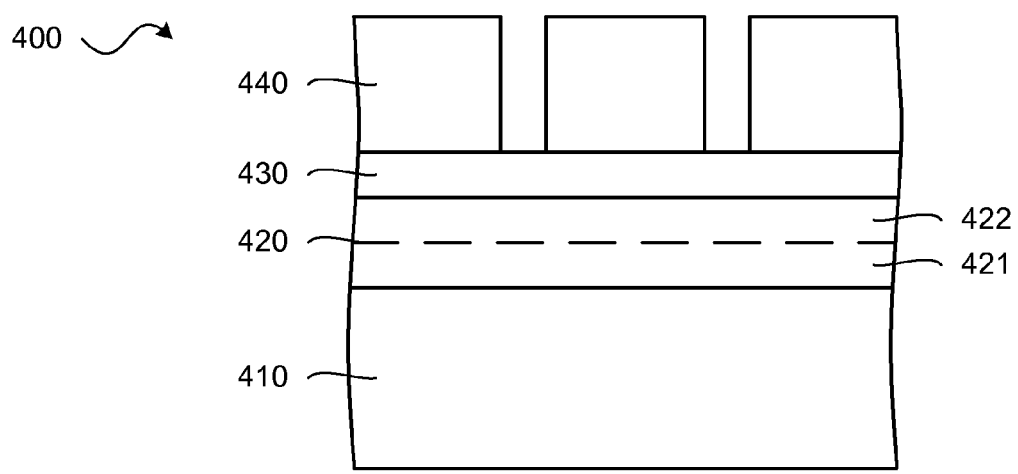

A photoresist layer 440 with features is formed over the bottom anti-reflection coating layer 430 (step 120), as shown in FIG. 4C. Photoresist is a light-sensitive material. Features or patterns are transferred to the photoresist from a photomask using light. In one embodiment, the photoresist is a polymeric material.

Figure 4D:
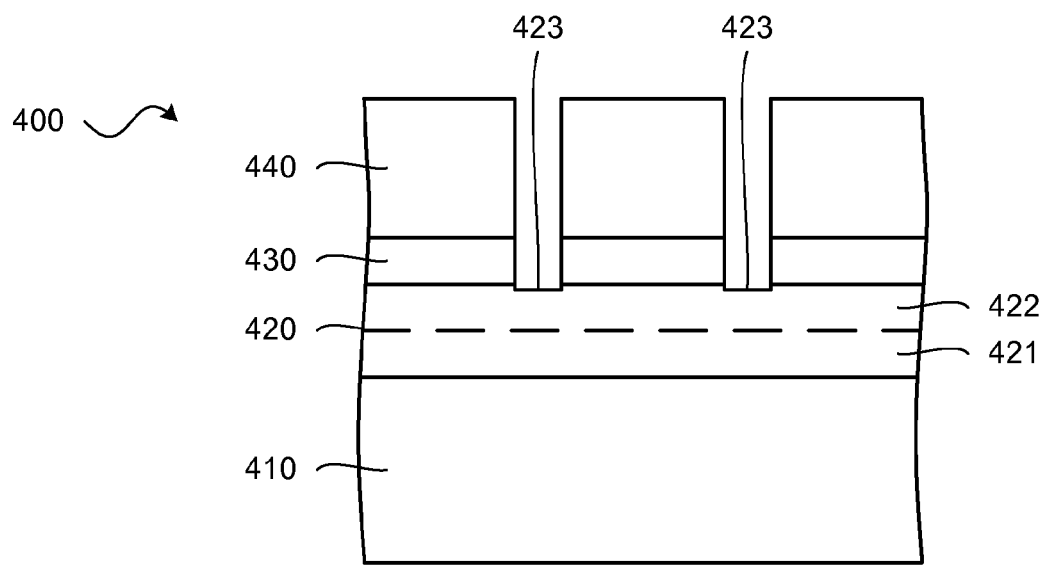
Figure 4E:
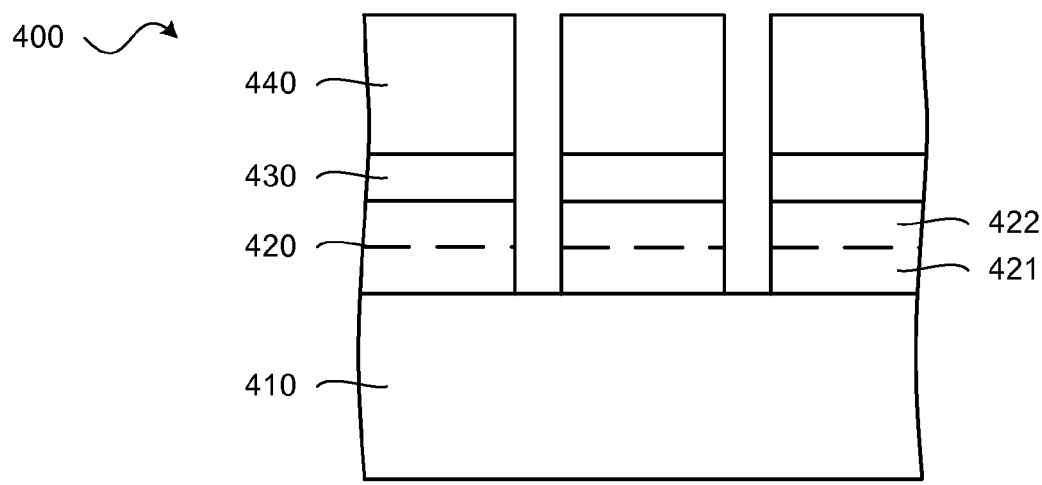

The stack 400 that includes the silicon substrate 410, the hard mask layer 420, the bottom anti-reflection coating layer 430, and the photoresist layer 440 is placed in the plasma reactor 200 (step 130). First, the bottom anti-reflection coating layer 430 is opened (step 140), as shown in FIG. 4D. The features or patterns defined in the photoresist layer 440 are transferred to the bottom anti-reflection coating layer 430. In the embodiment shown in FIG. 4D, after the bottom anti-reflection coating layer 430 is opened, slight recesses 423 are formed into the $SiO_2$ underlying layer 422, which is a part of the hard mask layer 420, at the bottom of the features. Next, the hard mask layer 420 is opened (step 150), as shown in FIG. 4E. The features defined in the photoresist layer 440 are continued to be transferred to the hard mask layer 420. If the hard mask layer 420 comprises multiple layers 421, 422 of different materials, as in the embodiment shown in FIG. 4E, then the features are transferred to all layers 421, 422 of the hard mask layer 420.

In this embodiment, to open the hard mask layer 420 (step 150), an opening gas is flowed into the plasma reactor 200. The opening gas may comprise $CF_4$, $CHF_3$, $O_2$, or Ar. A high frequency RF source 252 supplies RF power to the plasma reactor 200 at a frequency greater than or equal to 20 MHz. Preferably, the high frequency RF power has a frequency greater than or equal to 27 MHz. Preferably, the high frequency RF power supplies RF power between approximately 150 watts and 800 watts. A low frequency RF source 254 supplies RF power to the plasma reactor 200 at a frequency less than or equal to 20 MHz. Preferably, the low frequency RF power has a frequency of approximately 2 MHz. Preferably, the low frequency RF power supplies RF power between approximately 300 watts and 1200 watts. The opening gas is formed into a plasma. The plasma is used to open the hard mask 430. Once the features are opened in the hard mask layer 430, the flow of the opening gas is stopped.

For example, the following is a specific recipe that may be used for the opening of the hard mask layer 420 (step 150) in the embodiment shown in FIG. 4E: pressure at 120 miliTorr; the high frequency RF power source 252 supplying 150 watts of RF power at 27 MHz frequency; the low frequency RF power source 254 supplying 750 watts of RF power at 2 MHz frequency; and the opening gas flow comprises 600 sccm of Ar, 110 sccm of $CF_4$, 20 sccm of $CHF_3$, and 16 sccm of $O_2$.

Figure 4F:
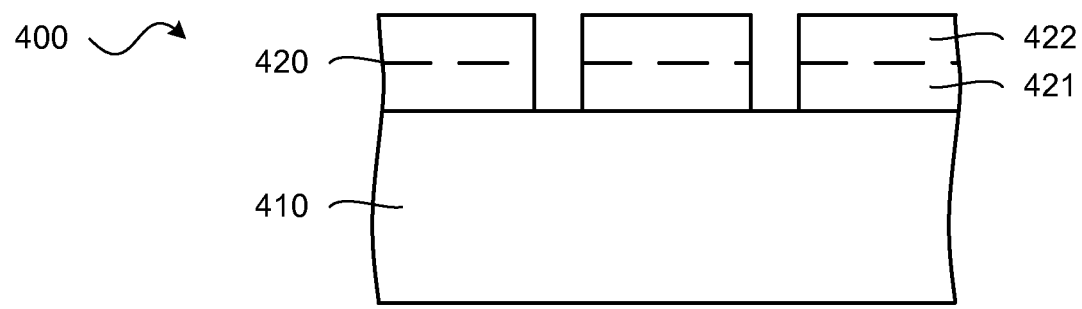

The remaining photoresist layer 440 and bottom anti-reflection coating layer 430 over the hard mask layer 420 are stripped (step 160). FIG. 4F is a schematic cross sectional view of the stack 400 after the photoresist layer 440 and the bottom anti-reflection coating layer 430 are removed. Thus, only the silicon substrate 410 and the hard mask layer 420 remain. In this embodiment, a stripping gas is flowed into the plasma reactor 200. In one embodiment, the stripping gas comprises at least $O_2$, $N_2$, or $H_2$. For example, the stripping may gas comprise at least $NH_3$, $O_2$, and CO or $CO_2$. A high frequency RF source 252 supplies high frequency RF power to the plasma reactor 200. Preferably, the high frequency RF power has a frequency greater than or equal to 20 MHz. More preferably, the high frequency RF power has a frequency greater than or equal to 27 MHz. Even more preferably, the high frequency RF power has a frequency greater than or equal to 60 MHz. Preferably, the high frequency RF power supplies RF power between approximately 200 watts and 800 watts. More preferably, the high frequency RF power supplies RF power at approximately 300 watts. A low frequency RF source 254 supplies low frequency RF power to the plasma reactor 200. Preferably, the low frequency RF power supplies RF power between 0 to 600 watts. More preferably, only a small amount, such as less than or equal to 50 watts, of low frequency RF power is supplied to the plasma reactor 200. More preferably, no low frequency RF power is supplied to the plasma reactor 200.

The stripping gas is formed into a plasma, which is used to strip away the remaining photoresist layer 440 and bottom anti-reflection coating layer 430. The stripping of the photoresist layer 440 and the bottom anti-reflection coating layer 430 is done in-situ. The photoresist layer 440 and the bottom anti-reflection coating layer 430 are stripped away while the wafer remains in the same plasma chamber where the bottom anti-reflection coating layer 430 and the hard mask layer 420 are opened and shortly after the hard mask layer 420 is opened. Once the photoresist layer 440 and bottom anti-reflection coating layer 430 are completely removed, the flow of the stripping gas is stopped.

For example, the following is a specific recipe that may be used for the stripping of the photoresist layer 440 and the bottom anti-reflection coating layer 430 (step 160) in the embodiment shown in FIG. 4F: pressure at 300 miliTorr; the high frequency RF power source 252 supplying 300 watts of RF power at 27 MHz frequency; and the stripping gas flow comprises 1000 sccm of $O_2$ and 50% center weighting of gas feeding (gases are normally fed into the processing chamber via two different paths: center and edge).

Figure 4G:
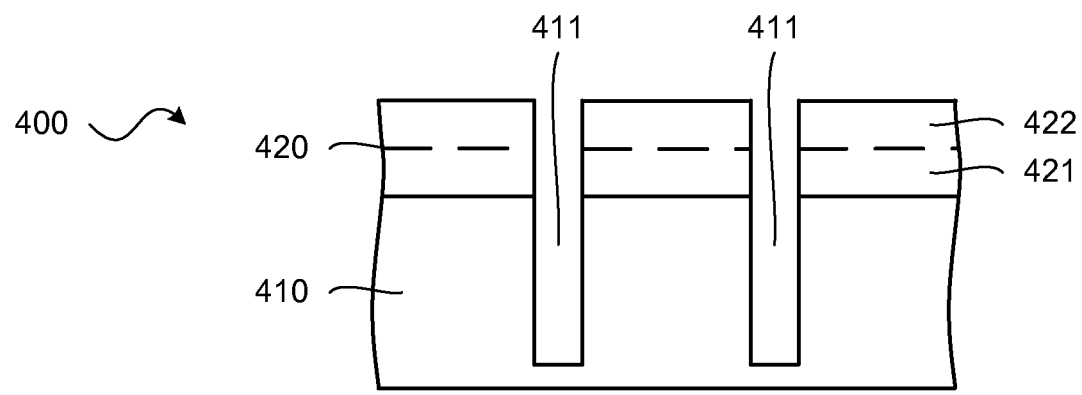

The stack 400 that includes the silicon substrate 410 and the opened hard mask layer 420 is removed from the plasma reactor 200 (step 170). Features 411 are etched into the silicon substrate 410 through the opened hard mask layer 420 (step 180). The recipe used for etching depends on the type of material that has to be etched. In this embodiment, because the substrate 410 is silicon, an appropriate recipe suitable for etching silicon material should be chosen. An etch gas is flowed into the etch chamber and one or more types of RF powers are supplied to the etch chamber to form the etch gas into a plasma, which is used to etch the silicon substrate 410. Once the etching is complete, the flow of the etch gas is stopped. FIG. 4G is a schematic cross-sectional view of the stack 400 after the features 411 have been etched into the silicon substrate 410 to define active areas.

Figure 4H:
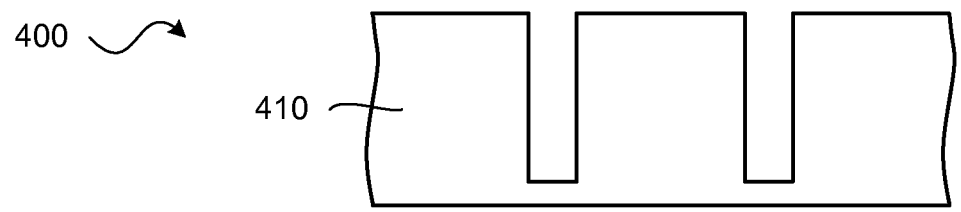

The remaining hard mask layer 420 is removed (step 190). A normal organic layer stripping process, such as phosphoric acid ($H_3PO_4$) may be used. FIG. 4H is a schematic cross-sectional view of the stack 400 after the hard mask layer 420 has been stripped. Only the silicon substrate 410 with features remains.

In the above example, the opening of the bottom anti-reflection coating layer 430 and the hard mask layer 420 and the stripping of the photoresist layer 440 and the bottom anti-reflection coating layer 430 after the hard mask layer 420 is opened are performed in-situ, i.e., in the same plasma processing chamber. The etching of the silicon substrate 410 and the stripping of the hard mask layer 420 after the silicon substrate 410 is etched are performed elsewhere in separate equipments. Alternatively, in another example, all five steps, the opening of the bottom anti-reflection coating layer 430 (step 140), the opening of the hard mask layer 420 (step 150), the stripping of the remaining photoresist layer 440 and bottom anti-reflection coating layer 430 (step 160), the etching of the silicon substrate 410 (step 180), and the stripping of the hard mask layer 420 (step 190), may be done in-situ.

The present invention applies to various types of etching processes, such as via etching and trench etching. The present invention has many benefits. For example, it has been found that not using a low frequency RF power or using only a small amount of the low frequency RF power during the stripping of the photoresist layer after opening the hard mask prevents the hard mask from top corner rounding or faceting. The reduction of faceting of the hard mask has been found to reduce faceting of the etched features. Higher frequency RF plasma ashing provides higher efficiency in removing polymer deposits from the sidewall of the etched features in the hard mask layer.

It has also been found that this example extends mean time between cleanings. After each hard mask open process, waferless cleaning of chamber with oxidation chemistry is performed to keep the inside of reactor clean. During the cleaning, fluorine-containing polymer deposits accumulated on reactor wall after HMO processes are removed. Although waferless cleaning is performed after every wafer, wet cleaning is required periodically by dissembling the reactor parts and scrubbing the contaminants from the surfaces of reactor parts using liquid solvents. In-situ stripping of the photoresist layer extends the mean time between wet cleaning because both stripping and cleaning use the same oxidation chemistry. Consequently, the possibility of particle issues caused by polymer flakes peeled off from reactor wall surfaces is reduced.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

The invention claimed is:

1. An apparatus for etching features in a silicon layer, wherein the silicon layer is under a hard mask layer, which in turn is under a photoresist layer, comprising:
   a plasma processing chamber, comprising:
      a chamber wall forming a plasma processing chamber enclosure;
      a substrate support for supporting a substrate within the plasma processing chamber enclosure;
      a pressure regulator for regulating the pressure in the plasma processing chamber enclosure;
      at least one electrode for providing power to the plasma processing chamber enclosure for sustaining a plasma;
      a high frequency power source electrically connected to the at least one electrode;
      a low frequency power source electrically connected to the at least one electrode;
      a gas inlet for providing gas into the plasma processing chamber enclosure; and
      a gas outlet for exhausting gas from the plasma processing chamber enclosure;
   a gas source in fluid connection with the gas inlet, comprising:
      an opening gas source; and
      a photoresist stripping gas source; and
   a controller controllably connected to the gas source and the at least one RF power source, comprising:
      at least one processor; and
      a non-transitory computer readable media, comprising:
         computer readable code for opening the hard mask layer; and
         computer readable code for stripping the photoresist layer, comprising computer readable code for providing a stripping gas;
computer readable code for forming a plasma with the stripping gas by providing a high frequency RF power and a low frequency RF power, wherein the low frequency RF power has a power less than 50 watts; and
computer readable code for stopping the stripping gas when the photoresist layer is stripped,
wherein the use of low frequency RF power during the stripping of the photoresist layer after opening the hard mask prevents the hard mask from corner rounding or faceting.

2. The apparatus, as recited in claim 1, wherein the hardmask comprises a layer of $Si_3N_4$ over the silicon layer and a layer of $SiO_2$ over the layer of $Si_3N_4$.

3. The apparatus, as recited in claim 2, wherein the low frequency RF power has a power of 0 watt.

4. The apparatus, as recited in claim 3, wherein the high frequency RF power has a power between approximately 200 watts and 800 watts.

5. The apparatus, as recited in claim 4, wherein the high frequency RF power has a power of approximately 300 watts.

6. The apparatus, as recited in claim 1, wherein the stripping gas source comprises at least one of a $O_2$, $N_2$, or $H_2$ gas source and wherein the stripping gas comprises at least one gas selected from the group consisting of $O_2$, $N_2$, or $H_2$.

7. The apparatus, as recited in claim 6, wherein the stripping gas source further comprises a halogen source and wherein the stripping gas further comprises halogen.

8. The apparatus, as recited in claim 4, wherein the computer readable code for opening the hard mask layer comprises
computer readable code for providing an opening gas from the opening gas source;
computer readable code for forming a plasma with the opening gas by providing a high frequency RF power and a low frequency RF power; and
computer readable code for stopping the opening gas when the hard mask layer is opened.

9. The apparatus, as recited in claim 8, wherein a bottom anti-reflection coating layer is over the hard mask layer and under the photoresist layer, further comprising:
computer readable code for opening the bottom anti-reflection coating layer; and
computer readable code for stripping the bottom anti-reflection coating layer.

10. The apparatus, as recited in claim 9, wherein the computer readable code for stripping the bottom anti-reflection coating layer comprises:
computer readable code for providing a stripping gas;
computer readable code for forming a plasma with the stripping gas by providing a high frequency RF power and a low frequency RF power, wherein the low frequency RF power has a power less than 50 watts; and
computer readable code for stopping the stripping gas when the bottom anti-reflection coating layer is stripped.

11. The apparatus, as recited in claim 9, further comprising:
computer readable code for etching the silicon layer; and
computer readable code for stripping the hard mask layer.

12. An apparatus for etching features in a silicon layer, wherein the silicon layer is under a hard mask layer, which in turn is under a photoresist layer, comprising:
a plasma processing chamber, comprising:
a gas source and feed system arranged to enable gas flow into the chamber;
the source comprising:
an opening gas source; and
an stripping gas source; and
a controller operatively connected with the gas source and with at least one RF power source arranged to generate plasma in the chamber, comprising:
at least one processor; and
non-transitory computer readable media, comprising:
computer readable code for performing an operation of opening the hard mask layer; and
computer readable code for performing an operation of in situ stripping of the photoresist layer while maintaining the hard layer, comprising,
computer readable code for performing an operation of providing a photoresist stripping gas;
computer readable code for performing an operation of forming a plasma with the photoresist stripping gas by providing a high frequency RF power and a low frequency RF power, wherein the low frequency RF power has a power less than 50 watts; and
computer readable code for performing an operation of stopping the stripping gas when the photoresist layer is stripped,
wherein the use of low frequency RF power during the stripping of the photoresist layer after opening the hard mask prevents the hard mask from corner rounding or faceting.

13. The apparatus recited in claim 12 further comprising and arrangement wherein:
the plasma processing chamber comprises:
a chamber wall forming a plasma processing chamber enclosure;
a substrate support for supporting a substrate within the plasma processing chamber enclosure;
a pressure regulator for regulating the pressure in the plasma processing chamber enclosure;
at least one electrode for providing power to the plasma processing chamber enclosure for sustaining a plasma;
said at least one RF power source electrically connected to the at least one electrode;
a gas inlet for providing gas into the plasma processing chamber enclosure; and
a gas outlet for exhausting gas from the plasma processing chamber enclosure.

14. The apparatus, as recited in claim 13, wherein the stripping gas consists of at least one of $NH_3$, $N_2$, $H_2$, $O_2$, CO, and $CO_2$.

15. The apparatus, as recited in claim 13, wherein the photoresist stripping gas consists of at least one of $NH_3$, $N_2$, $H_2$, $O_2$, CO, and $CO_2$ and a halogen.

16. The apparatus, as recited in claim 13, wherein the photoresist stripping gas consists of at least one of $NH_3$, $N_2$, $H_2$, $O_2$, CO, $CO_2$ and a carrier.

17. The apparatus, as recited in claim 13, wherein the stripping gas consists of at least one of $NH_3$, $N_2$, $H_2$, CO, and $CO_2$.

18. The apparatus, as recited in claim 13, wherein the low frequency RF power has a power of 0 watt.

19. The apparatus, as recited in claim 13, computer readable code for providing a photoresist stripping gas wherein photoresist stripping gas is introduced into the plasma processing chamber enclosure using a center weighted gas feeding.

20. The apparatus, as recited in claim 1, further comprising computer readable code for opening an anti-reflection coating layer.

* * * * *